(12) United States Patent
Kamaga et al.

(10) Patent No.: US 8,841,741 B2
(45) Date of Patent: Sep. 23, 2014

(54) HIGH BREAKDOWN VOLTAGE SEMICONDUCTOR RECTIFIER

(75) Inventors: Masamu Kamaga, Tokyo (JP); Makoto Mizukami, Kanagawa (JP); Takashi Shinohe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 13/226,883

(22) Filed: Sep. 7, 2011

(65) Prior Publication Data

US 2012/0228734 A1 Sep. 13, 2012

(30) Foreign Application Priority Data

Mar. 10, 2011 (JP) ................. 2011-052786

(51) Int. Cl.
*H01L 31/102* (2006.01)
*H01L 29/66* (2006.01)
*H01L 29/861* (2006.01)
*H01L 29/06* (2006.01)

(52) U.S. Cl.
CPC ........ *H01L 29/0615* (2013.01); *H01L 29/8613* (2013.01); *H01L 29/6609* (2013.01); *H01L 29/0692* (2013.01)
USPC ................ 257/458; 257/656; 257/E33.046; 257/E29.336; 257/E31.036

(58) Field of Classification Search
CPC .................................................. H01L 29/868
USPC .................. 257/458, 656, E33.046, E29.336, 257/E31.036, E31.087–E31.088, 257/E31.061–E31.062, 487, 491, 494–496
See application file for complete search history.

(56) References Cited

U.S. PATENT DOCUMENTS

| 2005/0045982 A1* | 3/2005 | Shenai ........................... 257/481 |
| 2007/0090370 A1* | 4/2007 | Nakayama et al. ............. 257/77 |
| 2010/0032685 A1* | 2/2010 | Zhang et al. .................... 257/77 |

FOREIGN PATENT DOCUMENTS

| JP | 7-221326 | 8/1995 |
| JP | 2002-185015 | 6/2002 |
| JP | 2002-261295 | 9/2002 |
| JP | 2003-197921 | 7/2003 |
| JP | 2005-167035 | 6/2005 |

(Continued)

OTHER PUBLICATIONS

Office Action issued on Feb. 19, 2013 in the counterpart Japanese Patent Application No. 2011-052786 (with English Translation).

(Continued)

*Primary Examiner* — Steven Loke
*Assistant Examiner* — Juanita B Rhodes
(74) *Attorney, Agent, or Firm* — Oblon, Spivak, McClelland, Maier & Neustadt, L.L.P.

(57) ABSTRACT

A high breakdown voltage diode of the present embodiment includes a first conductive semiconductor substrate, a drift layer formed on the first conductive semiconductor substrate and formed of a first conductive semiconductor, a buffer layer formed on the drift layer and formed of a second conductive semiconductor, a second conductive high concentration semiconductor region formed at an upper portion of the buffer layer, a mesa termination unit formed on an end region of a semiconductor apparatus to relax an electric field of the end region when reverse bias is applied between the semiconductor substrate and the buffer layer, and an electric field relaxation region formed at the mesa termination unit and formed of a second conductive semiconductor.

A breakdown voltage of a high breakdown voltage diode, in which a pn junction is provided to a semiconductor layer, is increased, and a process yield is improved.

9 Claims, 8 Drawing Sheets

(56) References Cited

FOREIGN PATENT DOCUMENTS

| JP | 2009-87973 | 4/2009 |
| JP | 2010-45363 | 2/2010 |
| JP | 2010-171283 | 8/2010 |
| WO | WO 02/49114 A2 | 6/2002 |
| WO | WO 02/49114 A3 | 6/2002 |

OTHER PUBLICATIONS

Office Action mailed Sep. 3, 2013 in Japanese Application No. 2011-052786 filed Mar. 10, 2011 (w/English translation).

\* cited by examiner

HIGH BREAKDOWN VOLTAGE SEMICONDUCTOR RECTIFIER

CROSS-REFERENCE TO RELATED APPLICATION

This application is based upon and claims the benefit of priority from the prior Japanese Patent applications No. JP2011-052786, filed on Mar. 10, 2011; the entire contents of which are incorporated herein by reference.

FIELD

Embodiments described herein relates to a high breakdown voltage semiconductor rectifier in which a pn junction is provided to a semiconductor layer.

BACKGROUND

A semiconductor power conversion apparatus has been fabricated in a small size with high efficiency and high performance. Therefore, it is important to reduce loss and increase a breakdown voltage of a semiconductor rectifier (a diode) used in the semiconductor power conversion apparatus.

Furthermore, a wide bandgap semiconductor is expected, in which as the next generation power semiconductor device material, for example, silicon carbide (hereinafter, also referred to as SiC) is used as a representative material. The wide bandgap semiconductor has a wide bandgap with respect to those employing silicon (hereinafter, also referred to as Si), and has high breakdown field strength and high thermal conductivity as compared with those employing Si. When utilizing these characteristics, a low-loss power semiconductor device capable of operating at a high temperature may be realized.

In this regard, due to the application of a diode using SiC, it is further expected that a semiconductor power conversion apparatus can be fabricated in a small size with high efficiency and high performance. Specifically, in the range of a high breakdown voltage exceeding 2 kV, it is expected to reduce the loss and increase the breakdown voltage of a PiN diode including a pn junction.

DETAILED DESCRIPTION

Figure 1:
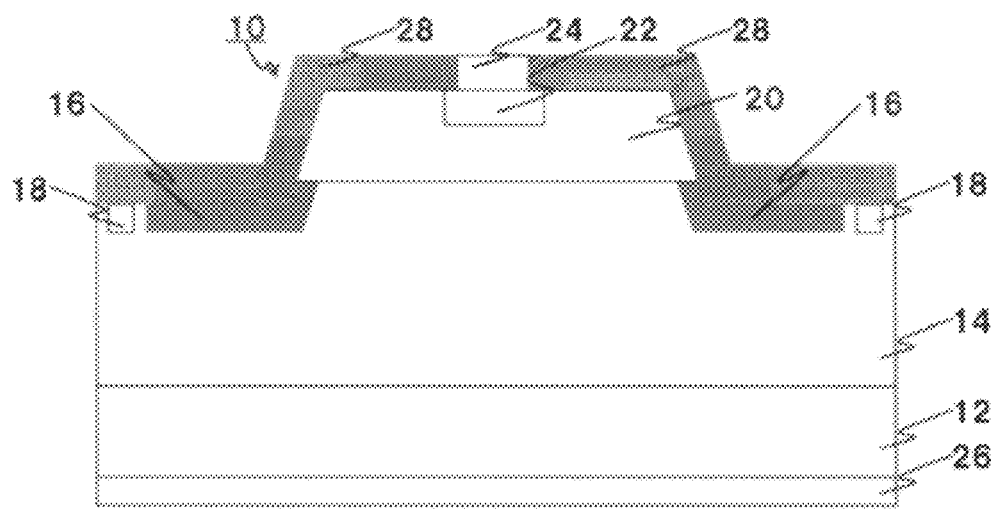
FIG. 1 is a sectional view illustrating a semiconductor rectifier according to a first embodiment.
Figure 2:
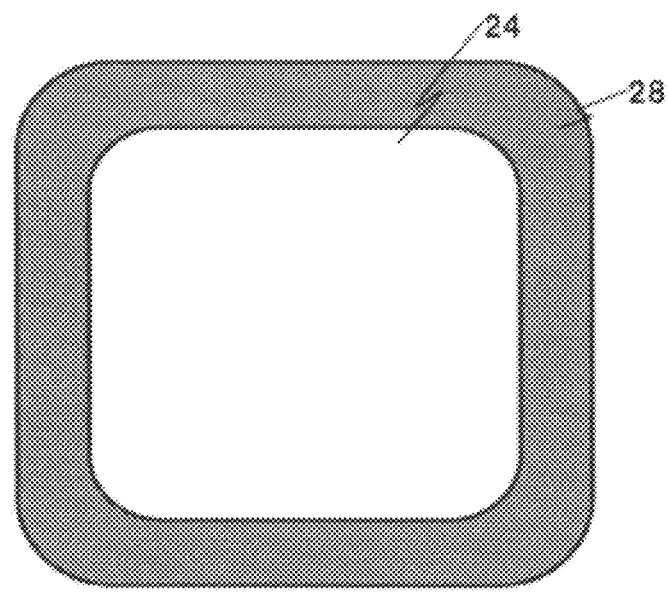
FIG. 2 is a diagram as viewed from the upside of the semiconductor rectifier according to the first embodiment.

An object of the present embodiment is to provide a semiconductor apparatus capable of realizing a high process yield in a PiN diode which is a high breakdown voltage semiconductor rectifier.

A high breakdown voltage semiconductor rectifier of the present embodiment includes: a first conductive semiconductor substrate; a drift layer formed on the first conductive semiconductor substrate and formed of a first conductive semiconductor; a buffer layer formed on the drift layer and formed of a second conductive semiconductor; a second conductive high concentration semiconductor region formed at an upper portion of the buffer layer; a mesa termination unit formed on an end region of a semiconductor apparatus to relax an electric field of the end region when reverse bias is applied between the semiconductor substrate and the buffer layer; and an electric field relaxation region formed at the mesa termination unit and formed of a second conductive semiconductor.

Hereinafter, embodiments will be described with reference to the related art.

Conventionally, there has been disclosed a SiC-PiN diode which includes a mesa structure unit for relaxing an electric field at the time of reverse bias and a JTE region formed by ion implantation, allows an impurity concentration of the JTE region formed with a mesa angle and a mesa bottom surface to be in a predetermined range, and allows a passivation film of a mesa corner unit to have a thickness of 500 nm or more.

In the PiN diode including the mesa structure unit and the JTE region formed by the ion implantation, a breakdown voltage may be significantly reduced by slight shift of the impurity concentration of the JTE region formed by the ion implantation.

For example, in the SiC-PiN diode having a breakdown voltage of 6000 V or more when the impurity concentration of the JTE region is $1.8 \times 10^{17}$ cm$^{-3}$, if the impurity concentration of the JTE region is shifted to a high concentration side and reaches $1.9 \times 10^{17}$ cm$^{-3}$, the breakdown voltage is reduced to 4000 V or less, and if the impurity concentration of the JTE region is shifted to a low concentration side and reaches $1.2 \times 10^{17}$ cm$^{-3}$, the breakdown voltage is reduced to 5000 V or less, which has been confirmed by the inventors.

Meanwhile, there has been proposed a structure capable of preventing the reduction of a breakdown voltage by manufacturing the mesa structure unit in a two-step structure even when the impurity concentration of the JTE region is shifted.

However, in order to manufacture the mesa structure unit in the two-step structure, an etching process should be performed twice. Furthermore, in the etching process, control in the depth direction is difficult and a variation may easily occur in the depth in the wafer surface.

That is, in the latter structure, a process yield is solved in terms of dependence of the impurity concentration of the JTE region, but may be reduced due to the control in the depth direction in the etching process.

On the other hand, according to the present embodiment, since a second conductive buffer layer has a breakdown voltage, a diode with a higher breakdown voltage is provided.

Furthermore, according to the present embodiment, even when the impurity concentration of the JTE region is shifted to a low concentration side, a breakdown voltage is not suddenly reduced and a high breakdown voltage can be maintained, resulting in the improvement of a yield in the semiconductor process.

Furthermore, according to the present embodiment, since it is not necessary to manufacture the mesa structure unit in the two-step structure, a variation and the like of the depth in the wafer surface due to control of an etching process is not problematic, resulting in the improvement of a yield in the semiconductor process.

Hereinafter, embodiments of the invention will be further described with reference to the accompanying drawings.

First Embodiment

A high breakdown voltage semiconductor rectifier of the present embodiment includes a first conductive substrate, a first conductive drift layer formed on the first conductive substrate, a second conductive buffer layer formed on the drift layer, a second conductive high concentration semiconductor region formed on the second conductive buffer layer, a mesa termination unit formed on an end region to relax an electric field of the end region of a semiconductor apparatus when reverse bias is applied between the first conductive substrate and the second conductive buffer layer, and a second conductive electric field relaxation region formed at the mesa termination unit.

With such a configuration, since the second conductive buffer layer has a breakdown voltage, a diode with a higher breakdown voltage is provided. Furthermore, according to the invention, even when the impurity concentration of the JTE region is shifted to a low concentration side, a breakdown voltage is not suddenly reduced and a high breakdown voltage can be maintained, resulting in the improvement of a yield in the semiconductor process.

Hereinafter, a PiN diode will be described as an example in which a semiconductor is a silicon carbide (hereinafter, referred to as a SiC), a first conductive type is an n type, and a second conductive type is a p type.

FIG. 1 is a schematic sectional view illustrating a PiN diode which is a high breakdown voltage semiconductor rectifier according to the present embodiment.

As illustrated in FIG. 1, in a PiN diode 10 according to the present embodiment, for example, an n–type SiC layer 14 (a drift layer) is formed on an n+type 4H—SiC substrate 12. The 4H—SiC substrate 12 and the n–type SiC layer 14, for example, contain nitride (N) as impurity.

Preferably, the drift layer has an impurity concentration of $5.0 \times 10^{13}$ cm$^{-3}$ to $5.0 \times 10^{15}$ cm$^{-3}$. This is for maintaining a breakdown voltage of approximately 1 kV to approximately 20 kV which is considered as an application range of a SiC-PiN diode.

A JTE region 16 including a p type SiC region is formed at the end portion of the n–type SiC layer 14. The JTE region is provided in order to stabilize the breakdown voltage of the PiN diode. The JTE region 16, for example, contains aluminum (Al) or boron (B) as impurity.

Furthermore, an n type channel stop region 18 is formed outside the JTE region 16 on the n–type SiC layer 14.

A p type buffer layer 20 is formed on the n–type SiC layer 14.

Preferably, the second conductive buffer layer has an impurity concentration of $5.0 \times 10^{15}$ cm$^{-3}$ to $5.0 \times 10^{17}$ cm$^{-3}$. This is because electric field concentration occurs at pn junction and a breakdown voltage is reduced if the impurity concentration is very high, but a hole injecting amount from an anode electrode in a conduction state is very reduced if the impurity concentration is very low.

The buffer layer 20 is interposed between the drift layer 14 and a high concentration semiconductor layer 22, resulting in the significant improvement of a breakdown voltage. That is, in the conventional SiC-PiN diode, a buffer layer is arranged in consideration of a hole injecting amount in a conduction state. In the present embodiment, the impurity concentration of the buffer layer is reduced to the extent that the hole injection is not obstructed, and the distance between the p type high concentration semiconductor layer 22 and the p type JTE region 16 (a second conductive electric field relaxation region) is optimized, resulting in an increase of a breakdown voltage.

The p type high concentration semiconductor region 22 is formed at the upper end of the p type buffer layer 20.

Preferably, the impurity concentration of the second conductive high concentration semiconductor region 22 formed at the upper portion of the p type buffer layer is higher than $5.0 \times 10^1 R$ cm$^{-3}$. This is for reducing contact resistance at the anode electrode.

Furthermore, for example, the p type high concentration semiconductor region 22 is provided on the surface thereof with an ohmic electrode region 24 with a first electrode (anode electrode) formed of Ni.

In addition, for example, the n+type 4H—SiC substrate 12 is provided on the surface thereof with a second electrode (cathode electrode) 26 formed of Ni.

In the semiconductor rectifier illustrated in FIG. 1, the distance between the p type high concentration semiconductor region 22 (the second conductive high concentration semiconductor region) and the p type JTE region 16 (the second conductive electric field relaxation region) is preferably higher than $\frac{1}{10}$ of the distance between the SiC substrate 12 (the first conductive substrate) and the p type buffer layer 20 (the second conductive buffer layer).

Figure 6:
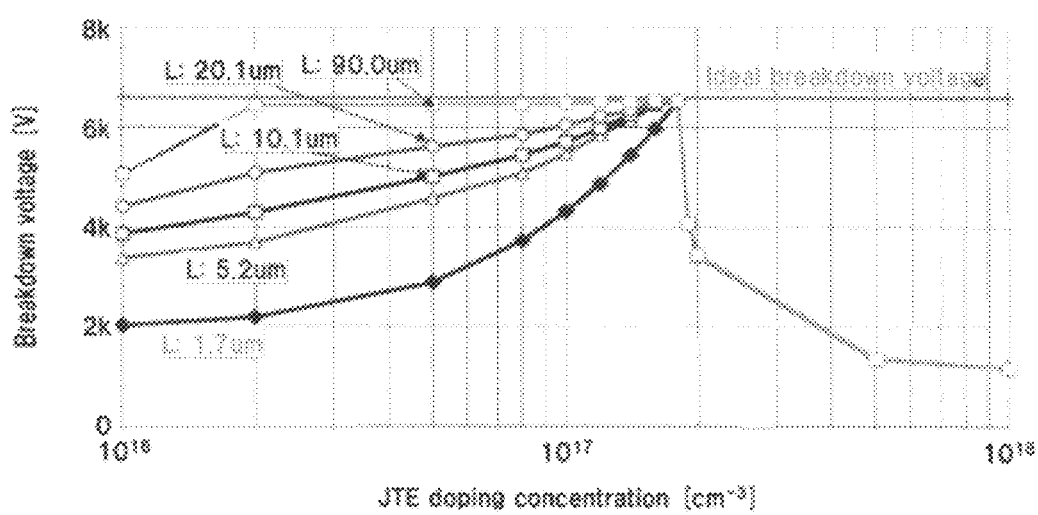
FIG. 6 is a diagram illustrating a relation between an impurity concentration and a breakdown voltage of a JTE region of the semiconductor rectifier according to the first embodiment.

FIG. 6 is a diagram illustrating a result obtained by simulating the relation among the impurity concentration of the p type JTE layer, the distance between the p type high concentration semiconductor region 22 and the p type JTE region 16, and the breakdown voltage.

Figure 5:
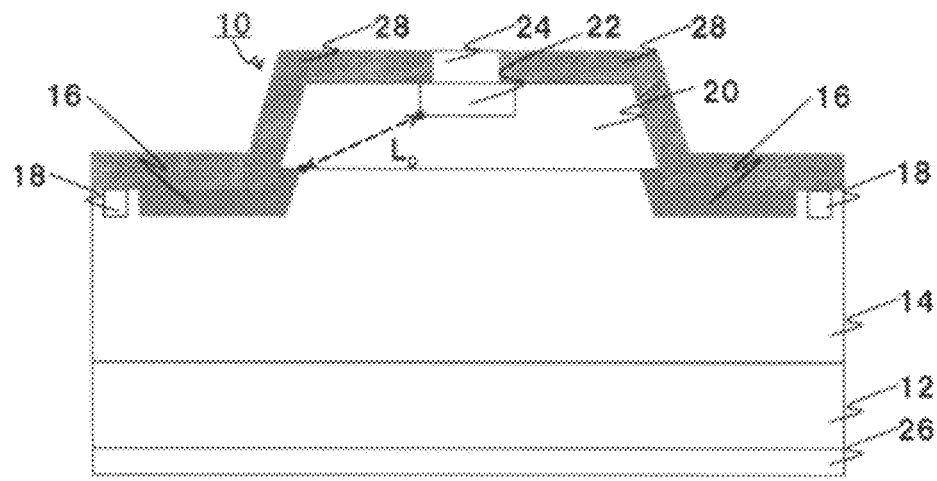
FIG. 5 is a sectional view illustrating the semiconductor rectifier according to the first embodiment.

As illustrated in FIG. 5 showing a schematic sectional view of the semiconductor rectifier, if the distance between the p type high concentration semiconductor region 22 (the second conductive high concentration semiconductor region) and the p type JTE region 16 (the second conductive electric field relaxation region) is indicated by Lp, the degree, by which the breakdown voltage depends on a variation of the impurity concentration, is reduced from a region where a value of the Lp exceeds 10 μm as illustrated in the graph of FIG. 6 indicating the simulation result, which shows suitable characteristics.

As described above, specifically, the Lp is set to be longer than a short one of $\frac{1}{10}$ of the distance between the SiC substrate 12 (the first conductive substrate) and the p type buffer layer 20 (the second conductive buffer layer) and 10 μm, resulting in the further improvement of the breakdown voltage.

(Manufacturing Method)

Next, a manufacturing method of the semiconductor rectifier of the present embodiment illustrated in FIG. 1 will be described with reference to FIGS. 3A to 3H and FIG. 4 which are sectional views illustrating the procedure for manufacturing the semiconductor rectifier.

Figure 3:
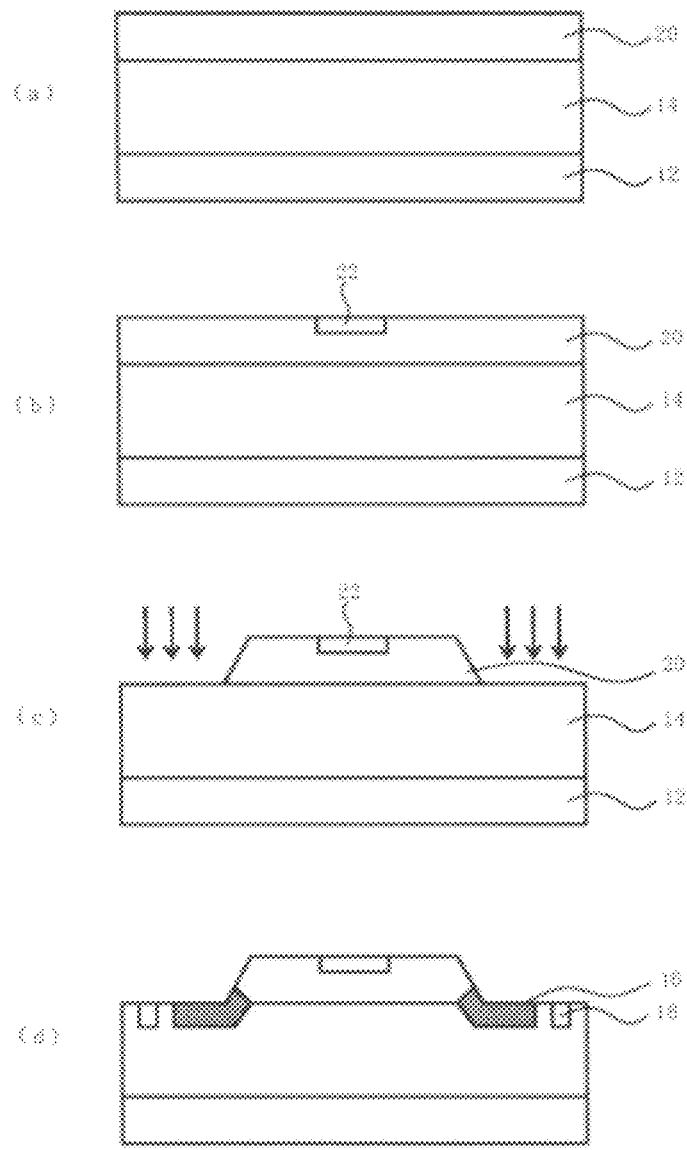
FIGS. 3 and 4 are manufacturing flowcharts of the semiconductor rectifier according to the first embodiment.
Figure 4:
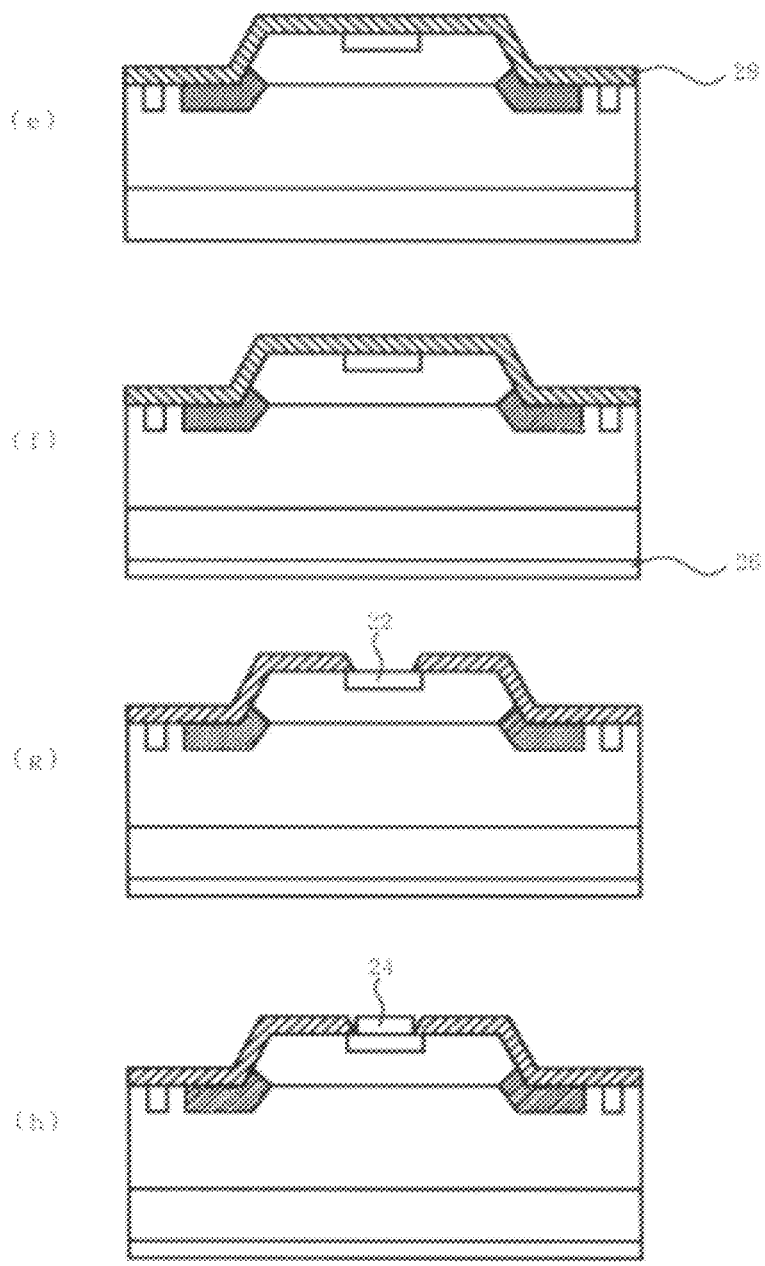

First, as illustrated in FIG. 3A, the n−type SiC layer 14 (the drift layer) and the p type buffer layer 20 are formed on the n+type 4H—SiC substrate 12 through epitaxial growth.

Next, as illustrated in FIG. 3B, the p type high concentration semiconductor region 22 is formed on the upper portion of the buffer layer through ion implantation. As ion implantation species, boron and the like are used. Furthermore, doping concentration is preferably higher than $5.0 \times 10^{18}$ cm$^{-3}$.

Then, as illustrated in FIG. 3C, edges of the buffer layer are selectively etched, thereby forming a mesa structure.

Thereafter, as illustrated in FIG. 3D, ions are implanted into a drift layer at the boundary between the buffer layer and the drift layer, thereby forming the p type JTE region 16 and the n type channel stop region 18. The n type channel stop region 18 may use aluminum or nitride as ion implantation species. Preferably, doping concentration is preferably higher than $5.0 \times 10^{17}$ cm$^{-3}$.

Next, as illustrated in FIG. 3E, a passivation film 28 for surface protection is formed on the entire surface of a SiC-PiN diode of SiC.

Then, as illustrated in FIG. 3F, for example, Ni is accumulated on the bottom surface of the 4H—SiC substrate 12 using a sputtering method, the second electrode (the cathode electrode) 26 is formed, and then a sintering process is performed.

Thereafter, as illustrated in FIG. 3G, a lithography process and an RIE process are performed in order to expose a part of the p type high concentration semiconductor region 22.

Next, as illustrated in FIG. 3H, for example, Ni is accumulated using a sputtering method, and is lifted-off, thereby forming the ohmic electrode region 24 of the first electrode (the anode electrode). Then, a sintering process is performed.

Through the above-mentioned manufacturing method, the PiN diode 10 illustrated in FIG. 1 can be manufactured.

Second Embodiment

Figure 7:
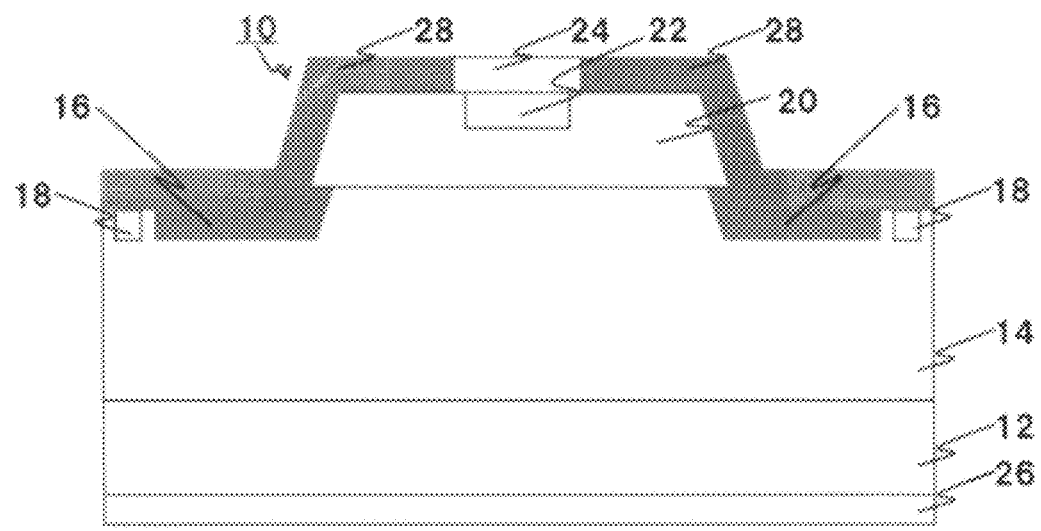
FIG. 7 is a sectional view illustrating a semiconductor rectifier according to a second embodiment.

A second embodiment of the high breakdown voltage semiconductor rectifier will be described with reference to FIG. 7 illustrating a schematic diagram of a PiN type diode. This embodiment is characterized in that the area of the anode electrode 24 is larger than that of the p type high concentration semiconductor region 22. The PiN type diode has the following characteristics. That is, the anode electrode 24 makes contact with the p type buffer layer 20, so that carriers are smoothly discharged when the PiN diode is turned off, resulting in the improvement of turn-off characteristics.

Third Embodiment

Figure 8:
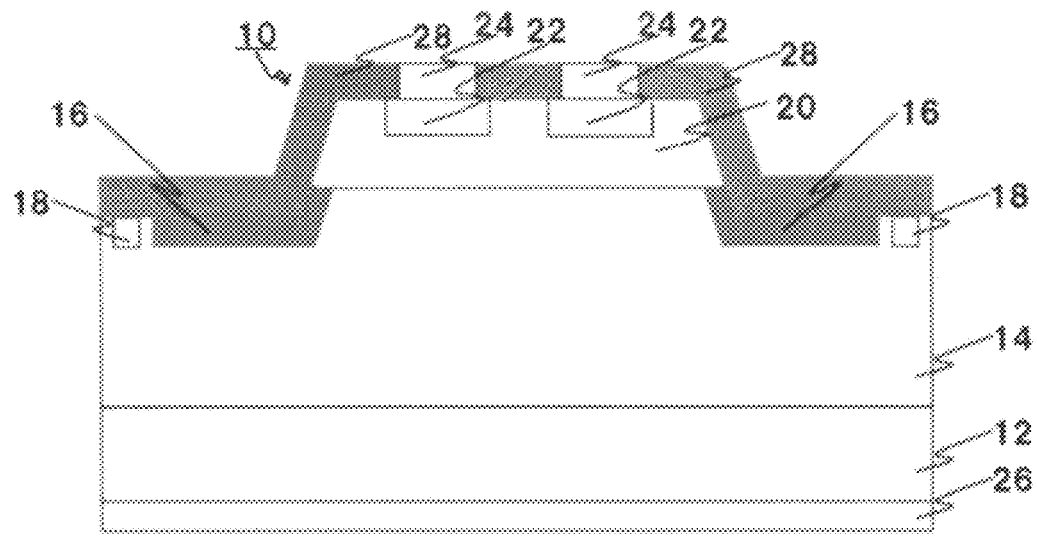
FIG. 8 is a sectional view illustrating a semiconductor rectifier according to a third embodiment.

A third embodiment of the high breakdown voltage semiconductor rectifier will be described with reference to FIG. 8 illustrating a schematic sectional view of a PiN type diode. This embodiment is characterized in that plural anode electrodes 24 and plural p type high concentration semiconductor regions 22 are formed on the buffer layer 20. The PiN type diode has the following characteristics. That is, the areas of the electrodes and the p type high concentration semiconductor regions 22 are made small, resulting in the improvement of switching characteristics of the PiN diode. In addition, these regions exist in a plural number, so that a current uniformly flows over the chip, resulting in the avoidance of local heat concentration in a conduction state.

The area of the anode electrode 24 may be larger than that of the p type high concentration semiconductor region 22, or vice versa. When the area of the anode electrodes 24 is large, turn-off characteristics are improved. Meanwhile, when the area of the p type high concentration semiconductor regions 22 is large, a breakdown voltage yield is further improved.

Figure 9:
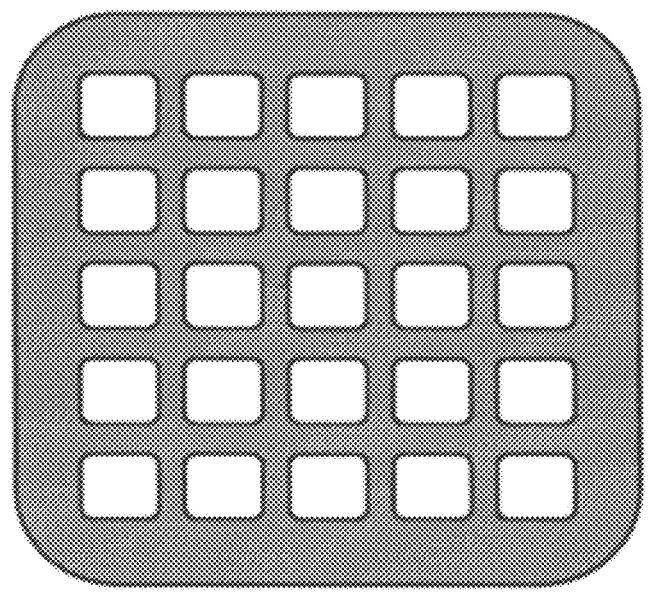
FIG. 9 is a diagram as viewed from the upside of the semiconductor rectifier according to the third embodiment.

FIG. 9 is a plan view illustrating the PiN type diode of the present embodiment. In this embodiment, the plural anode electrodes 24 are surrounded by the p type high concentration semiconductor region 22.

Fourth Embodiment

Figure 10:
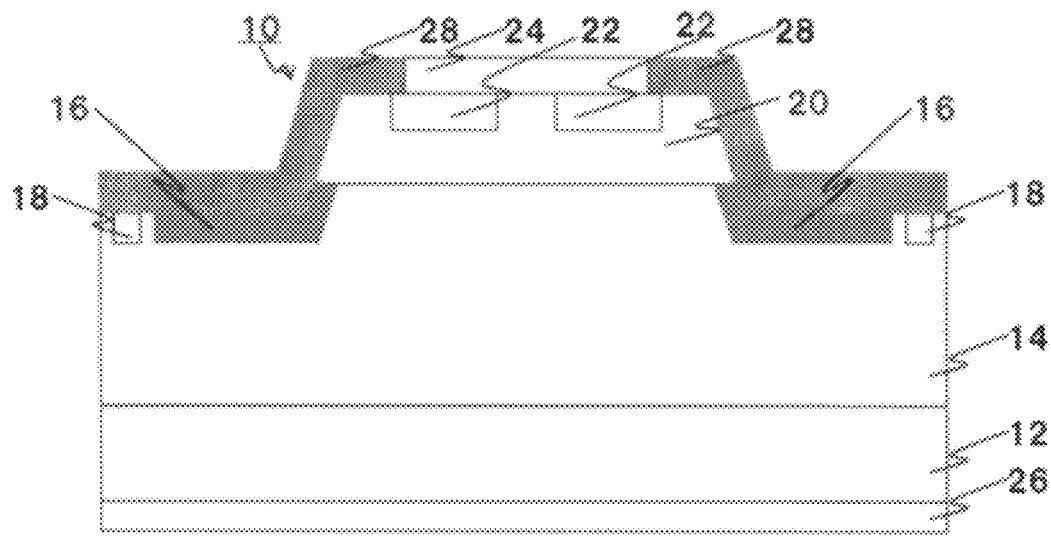
FIG. 10 is a sectional view illustrating a semiconductor rectifier according to a fourth embodiment.

A fourth embodiment of the high breakdown voltage semiconductor rectifier will be described with reference to FIG. 10 illustrating a schematic sectional view of a PiN type diode. This embodiment is characterized in that the PiN type diode includes plural p type high concentration semiconductor regions 22 and one anode electrode 24. The PiN type diode has the following characteristics. That is, the areas of the p type high concentration semiconductor regions 22 are made small, resulting in the improvement of turn-off characteristics of the PiN diode. Furthermore, these regions exist in a plural number, so that a current uniformly flows over the chip, resulting in the avoidance of local heat concentration in a conduction state. In addition, the electrode makes contact with the buffer layer, so that carriers are smoothly discharged when the PiN diode is turned off, resulting in the improvement of turn-off characteristics.

Fifth Embodiment

Figure 11:
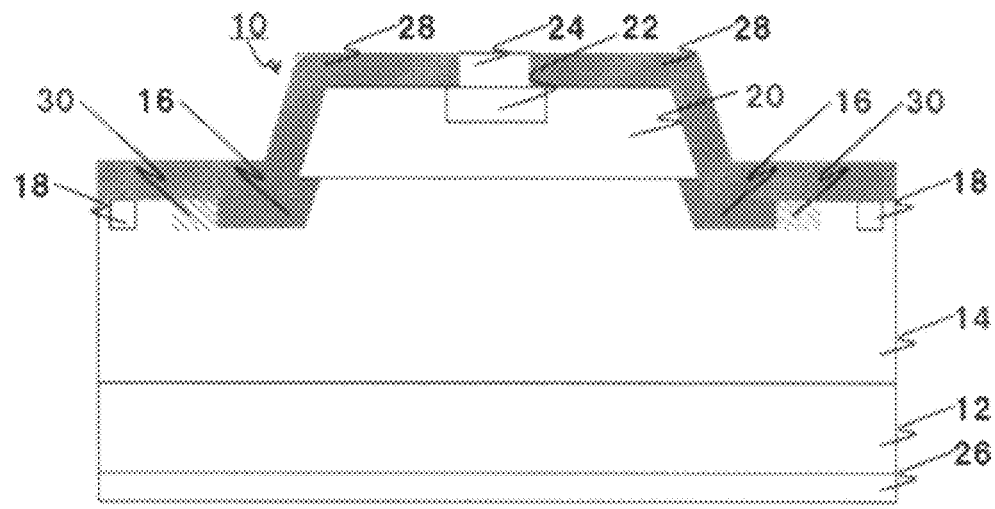
FIG. 11 is a sectional view illustrating a semiconductor rectifier according to a fifth embodiment.

A fifth embodiment of the high breakdown voltage semiconductor rectifier will be described with reference to FIG. 11 illustrating a schematic sectional view of a PiN type diode. This embodiment is characterized in that the PiN type diode includes a second p type JTE region 30 formed at the outer side of the p type JTE region 16. The PiN type diode has the following characteristics. That is, even when the impurity concentration of the p type JTE region 16 is shifted to a high concentration beyond a desired value, the second p type JTE region 30 relaxes an electric field, resulting in the improvement of a breakdown voltage yield.

In addition, three or more p type JTE regions may be provided.

Sixth Embodiment

Figure 12:
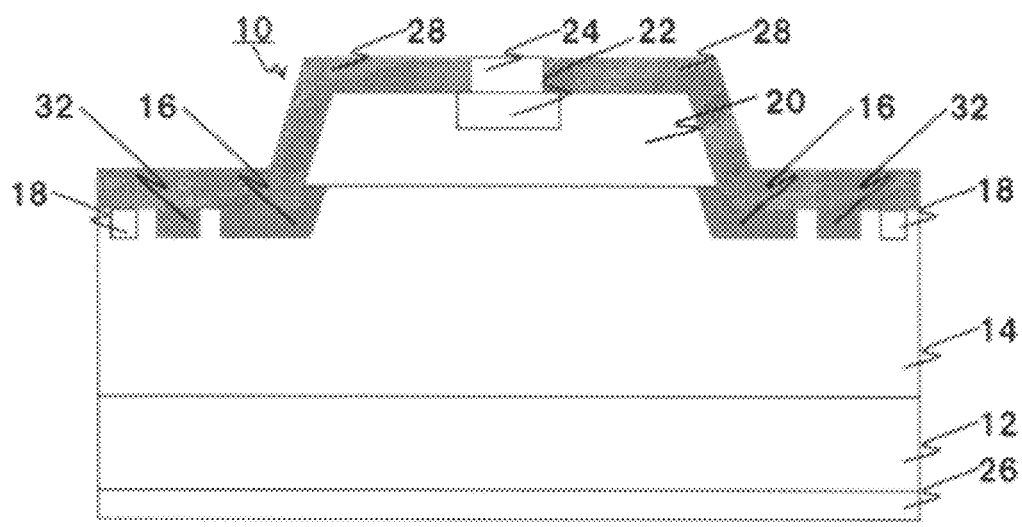
FIG. 12 is a sectional view illustrating a semiconductor rectifier according to a sixth embodiment.

A sixth embodiment of the high breakdown voltage semiconductor rectifier will be described with reference to FIG. 12 illustrating a schematic sectional view of a PiN type diode. This embodiment is characterized in that the PiN type diode includes a p type guard ring region 32 formed at the outer side of the p type JTE region 16. The PiN type diode has the following characteristics. That is, even when the impurity concentration of the p type JTE region 16 is shifted to a high concentration beyond a desired value, the p type guard ring region 32 relaxes an electric field, resulting in the improvement of a breakdown voltage yield.

In addition, three or more p type guard ring regions may be provided.

Seventh Embodiment

Figure 13:
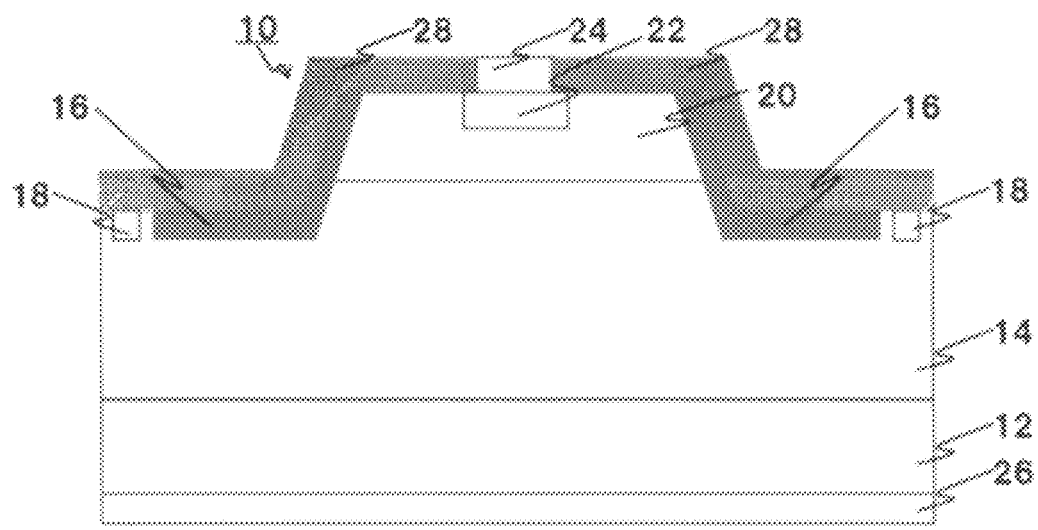
FIG. 13 is a sectional view illustrating a semiconductor rectifier according to a seventh embodiment.

A seventh embodiment of the high breakdown voltage semiconductor rectifier will be described with reference to FIG. 13 illustrating a schematic sectional view of a PiN type diode. This embodiment is characterized in that the PiN type diode includes a p type JTE region formed in the p type buffer layer 20.

So far, the embodiments have been described with reference to detailed examples. The embodiments are illustrative purposes only, and do not limit the invention. Furthermore, in the description of the embodiments, parts and the like, which are not directly necessary for describing the invention, have not been described in the semiconductor rectifier, the manufacturing method of the semiconductor rectifier and the like. However, required elements related to the semiconductor rectifier, the manufacturing method of the semiconductor rectifier and the like can be appropriately selected for use.

For example, the embodiments have described examples of the semiconductor rectifier in which the first conductive is the n type and the second conductive is the p type. However, a semiconductor rectifier may also be provided in which the first conductive is the p type and the second conductive is the n type.

Furthermore, the embodiments have described examples in which silicon carbide (SiC) is used as a semiconductor material. However, other representative semiconductor materials such as silicon, diamond and gallium nitride (GaN) may be applied.

Furthermore, the embodiments have described examples in which the first electrode uses Ni or Ti/Al as a material. However, other materials, for example, elemental substance such as Mo, W, Pt, Ta, or TaN, an alloy thereof, silicide, carbide and the like may be used.

Also, all semiconductor rectifiers including the elements of the invention and permitting appropriate design modification of those skilled in the art are included in the scope of the invention.

So far, a predetermined number of embodiments of the invention have been described. However, these embodiments are illustrative purposes only, and do not limit the scope of the invention. These new embodiments can be variously embodied, and various omissions, replacements and modifications can be made without departing from the scope of the invention. These embodiments and modifications thereof are included in the scope of the invention, and in the invention according to the scope of the claims and equivalents thereof.

While certain embodiments have been described, these embodiments have been presented by way of example only, and are note intended to limit the scope of the inventions. Indeed, the novel devices described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor rectifier comprising:
   a first conductive semiconductor substrate;
   a drift layer formed on the first conductive semiconductor substrate and formed of a first conductive semiconductor;
   a buffer layer formed on the drift layer and formed of a second conductive semiconductor;
   a second conductive high concentration semiconductor region formed at an upper portion of the buffer layer;
   a mesa termination unit having inclined side wall formed on an end region of the semiconductor rectifier to relax an electric field of the end region when reverse bias is applied between the semiconductor substrate and the buffer layer; and
   an electric field relaxation region formed at the mesa termination unit and formed of a second conductive semiconductor,
   wherein the buffer layer and the electric field relaxation region are directly connected, and the second conductive high concentration semiconductor region has sides horizontally displaced from sides of the electric field relaxation region thereby to create a horizontal displacement and increase a distance between the second conductive high concentration semiconductor region and the electric field relaxation region.

2. The semiconductor rectifier of claim 1, wherein the distance between the second conductive high concentration semiconductor region and the electric field relaxation region is longer than $1/10$ of a distance between the semiconductor substrate and the buffer layer.

3. The semiconductor rectifier of claim 1, wherein the distance between the high concentration semiconductor region and the electric field relaxation region is 10 μm or more.

4. The semiconductor rectifier of claim 1, wherein an impurity concentration of the buffer layer is lower than an impurity concentration of the electric field relaxation region.

5. The semiconductor rectifier of claim 1, wherein an impurity concentration of the buffer layer is $5.0\times10^{15}$ cm$^{-3}$ to $5.0\times10^{17}$ cm$^{-3}$.

6. The semiconductor rectifier of any one of claims 1 to 5, wherein a plurality of high concentration semiconductor regions is arranged at the upper portion of the buffer layer.

7. The semiconductor rectifier of claim 1, wherein an impurity concentration of the high concentration semiconductor region formed at the upper portion of the buffer layer is higher than $5.0\times10^{18}$ cm$^{-3}$.

8. The semiconductor rectifier of claim 1, wherein an impurity concentration of the drift layer is $5.0\times10^{13}$ cm$^{-3}$ to $5.0\times10^{15}$ cm$^{-3}$.

9. The semiconductor rectifier of claim 1, wherein the semiconductor substrate includes silicon carbide.

\* \* \* \* \*